(12) United States Patent
Goulier et al.

(10) Patent No.: US 12,132,495 B2
(45) Date of Patent: Oct. 29, 2024

(54) TELEPOWERED CONTACTLESS CARD

(71) Applicants: STMicroelectronics France, Montrouge (FR); STMicroelectronics (Grenoble 2) SAS, Grenoble (FR)

(72) Inventors: Julien Goulier, Grenoble (FR); Franck Montaudon, Meylan (FR)

(73) Assignees: Microelectronics France, Montrouge (FR); STMicroelectronics (Grenoble 2) SAS, Grenoble (FR)

(*) Notice: Subject to any disclaimer, the term of this patent is extended or adjusted under 35 U.S.C. 154(b) by 174 days.

(21) Appl. No.: 18/069,459

(22) Filed: Dec. 21, 2022

(65) Prior Publication Data

US 2023/0223948 A1    Jul. 13, 2023

(30) Foreign Application Priority Data

Jan. 7, 2022  (FR) .................................... 2200102

(51) Int. Cl.
  *H03M 1/12*      (2006.01)
  *H04B 5/72*      (2024.01)
  *G06K 19/077*    (2006.01)
  *H04B 5/00*      (2006.01)

(52) U.S. Cl.
  CPC .............. *H03M 1/124* (2013.01); *H04B 5/72* (2024.01); *G06K 19/07773* (2013.01); *H04B 5/00* (2013.01)

(58) Field of Classification Search
  CPC ........... H03M 1/124; H04B 5/72; H04B 5/00; H04B 5/0031; G06K 19/07773
  See application file for complete search history.

(56) References Cited

U.S. PATENT DOCUMENTS 10,740,575 B1   8/2020  Kim et al.
10,938,107 B2   3/2021  Cordier

FOREIGN PATENT DOCUMENTS

EP    1197927 A2 *  4/2002  ............. G06Q 20/10
FR    3070563 A1    3/2019
WO    2006008685 A1 1/2006

* cited by examiner

*Primary Examiner* — Joseph J Lauture
(74) *Attorney, Agent, or Firm* — Slater Matsil, LLP

(57) ABSTRACT

The present disclosure concerns an electronic device connected to an antenna. The electronic device delivers a first amplitude-modulated analog signal of a signal captured by the antenna, the capture signal associated with an electromagnetic field exhibiting intervals at a minimum level. The electronic device includes a first circuit, a second circuit, and a third circuit. The first circuit delivers a second analog signal by rectification and filters the first analog signal. The second circuit delivers a first binary signal based on the demodulation of the second analog signal. The third circuit couples the antenna to a resistor during each pause. The resistance value of the resistor depends on the maximum amplitude of the electromagnetic field before the pause.

20 Claims, 7 Drawing Sheets

TELEPOWERED CONTACTLESS CARD

CROSS-REFERENCE TO RELATED APPLICATIONS

This application claims priority to French Application No. 2200102, filed on Jan. 7, 2022, which application is hereby incorporated by reference herein in its entirety.

TECHNICAL FIELD

The present disclosure generally relates to electronic devices, and in particular embodiments, to telepowered contactless cards.

BACKGROUND

A telepowered contactless card is a card intended to exchange data with a terminal from which it draws its power supply. Data may be exchanged between a telepowered contactless card and a terminal by modulation of a magnetic field emitted by the terminal.

For certain applications, the maximum delay within which the card should start answering a message from the terminal may be imposed. The terminal may end the transmission of a message with a pause, during which the electromagnetic field is maintained at a minimum level, and at the end of which a response from a card is expected. This implies a proper detection by an electronic device of the card at the end of the pause following the message transmitted by the terminal. However, the signal captured by the card, representative of the electromagnetic field, may exhibit a wobbling which may cause an error in the detection by the electronic device of the card at the end of the pause following the message transmitted by the terminal.

SUMMARY

An object of an embodiment is to provide an electronic device for a telepowered contactless card overcoming all or part of the disadvantages of existing electronic devices.

According to an object of an embodiment, the electronic device of the telepowered contactless card is configured to detect the end of a pause of the electromagnetic field delivered by a terminal.

According to an object of an embodiment, the signal captured by the card, representative of the electromagnetic field emitted by the terminal, exhibits no wobbling during a pause.

An embodiment provides an electronic device intended to be connected to an antenna delivering a first amplitude-modulated analog signal of a signal captured from an electromagnetic field exhibiting intervals at a minimum level, including a first circuit for delivering a second analog signal by rectification and filtering of the first analog signal, a second circuit for delivering a first binary signal based on the demodulation of the second analog signal, and a third circuit for coupling the antenna to a resistor during each pause, the resistance value of the resistor depending on the maximum amplitude of the electromagnetic field preceding the pause.

An embodiment also provides a method of processing a first amplitude-modulated analog signal of a signal captured from an electromagnetic field exhibiting intervals at a minimum level delivered by an antenna, including the delivery, by a first circuit, of a second analog signal by rectification and filtering of the first analog signal, the delivery, by a second circuit, of a first binary signal based on the demodulation of the second analog signal, and the coupling, by a third circuit, of the antenna to a resistor during each pause, the resistance value of the resistor depending on the maximum amplitude of the electromagnetic field preceding the pause.

According to an embodiment, the third circuit is configured to couple the antenna to the resistor at the resistance value when the first binary signal switches from a first state to a second state.

According to an embodiment, the third circuit is configured to interrupt the coupling of the antenna to the resistor at the resistance value when the first binary signal switches from the second state to the first state.

According to an embodiment, the third circuit is configured to interrupt the coupling of the antenna to the resistor at the resistance value at the end of a constant duration.

According to an embodiment, the third circuit includes: an analog-to-digital converter configured to convert a third analog signal, representative of the second analog signal, into a first digital signal; a fourth circuit for delivering a second digital signal equal to the first digital signal with a delay; a fifth circuit for delivering a third digital signal configured to deliver the third digital signal at a constant digital value when the first binary signal is in a first state and configured to deliver the third digital signal equal to the second signal when the first binary signal switches from the first state to a second state; and a resistive digital-to-analog converter configured to convert the third digital signal into the resistance value.

According to an embodiment, the analog-to-digital converter is rated by a first clock signal and the fourth circuit includes first flip-flops rated by a second clock signal having as a frequency a sub-multiple of the frequency of the first clock signal.

According to an embodiment, the fifth circuit includes second flip-flops rated by the inverse of a second binary signal and receiving the second digital signal and logic AND-type gates each delivering the second binary signal at a first input and the output of one of the second flip-flops at a second input.

According to an embodiment, the second binary signal is equal to the first binary signal.

According to an embodiment, each rising edge of the second binary signal is simultaneous with the falling edge of the first binary signal and each falling edge of the second binary signal follows the rising edge of the second binary signal which precedes it by a constant duration.

An embodiment also provides a contactless read card including an antenna and an electronic device such as previously defined.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural or functional features that are common among the various embodiments may have the same references and may dispose identical structural, dimensional, and material properties. For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. Further, it is here considered that the terms "insulating" and "conductive" respectively signify "electrically insulating" and "electrically conductive."

In the following description, when reference is made to terms qualifying absolute positions, such as terms "front," "rear," "top," "bottom," "left," "right," etc., or relative positions, such as terms "above," "under," "upper," "lower," etc., or to terms qualifying directions, such as terms "horizontal," "vertical," etc., it is referred, unless specified otherwise, to the orientation of the drawings or to a display screen in a normal position of use.

Further, a signal which alternates between a first constant state, for example, a low state, noted "0," and a second constant state, for example, a high state, noted "1," is called a "binary signal." The high and low states of different binary signals of the same electronic circuit may be different. In practice, the binary signals may correspond to voltages or to currents which may not be perfectly constant in the high or low state.

Unless specified otherwise, the expressions "around," "approximately," "substantially" and "in the order of" signify within 10% and preferably within 5%. Unless specified otherwise, ordinal numerals such as "first," "second," etc. are only used to distinguish elements from one another. In particular, these adjectives do not limit the described embodiments to a specific order of these elements.

Figure 1:
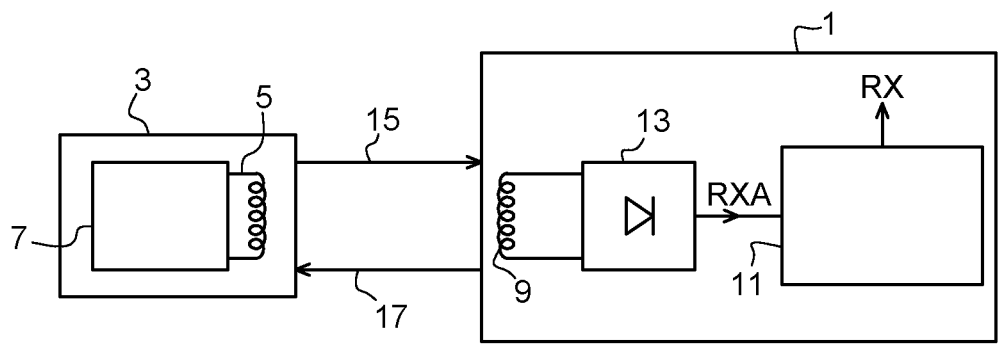
FIG. 1 is a block diagram of an embodiment telepowered contactless card arranged in the vicinity of a terminal.

FIG. 1 illustrates a telepowered contactless card 1 arranged in the vicinity of terminal 3. Terminal 3 includes an antenna 5 and an electronic circuit 7. Contactless card 1 includes an antenna 9 coupled to a data processing circuit 11, via a shaping circuit 13. Terminal 3 permanently emits an electromagnetic field. Thus, when card 1 is close to terminal 3, it is powered by antenna 9 and is capable of receiving a signal 15 and of transmitting a signal 17.

Terminal 3 for example emits an electromagnetic field at a frequency equal for example to 13.56 MHz, called the carrier wave hereafter. During a phase of transmission of a signal from terminal 3 to card 1, called the polling phase hereafter, terminal 3 modulates the carrier wave with a data signal, and the modulated carrier wave is received by the antenna 9 of card 1 and processing circuit 11 recovers the data signal. As an example, the transmission of a signal from terminal 3 to card 1 is performed by amplitude modulation of the carrier wave, particularly by 1-bit amplitude modulation such as defined by the ISO/IEC 14443 standard. Shaping circuit 13 delivers an analog signal RXA to processing circuit 11 obtained from the signal captured by antenna 9. Analog signal RXA is demodulated by processing circuit 11 for the determination of a binary signal RX.

During a phase of transmission of a signal from card 1 to terminal 3, called the response phase hereafter, processing circuit 11 may vary the current that it consumes. The current variations in antenna 9 translate as variations of the carrier wave which are then detected by terminal 3.

Card 1 must detect the end of a polling phase to start a response phase. According to an embodiment, during each polling phase, the electromagnetic field emitted by terminal 3 exhibits "pauses;" each pause corresponds to an interval during which the electromagnetic field has a minimum amplitude, for example, substantially null.

Figure 2:
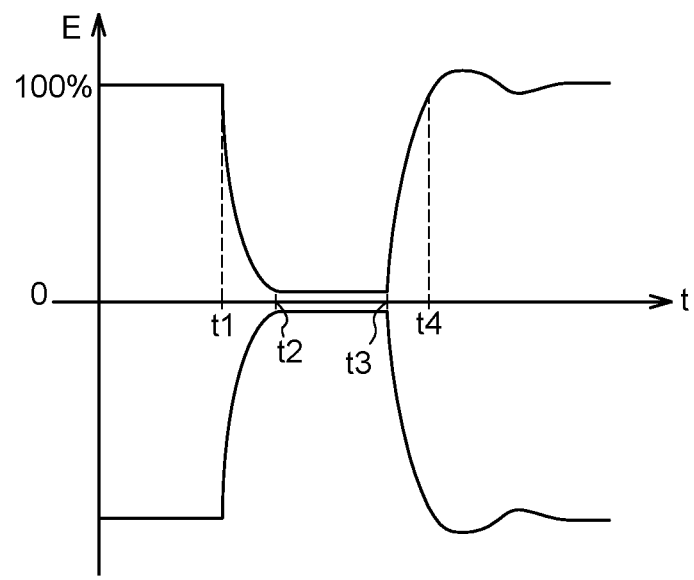
FIG. 2 is a timing diagram of an envelop of an embodiment electromagnetic signal transmitted by a terminal.

FIG. 2 illustrates a curve of variation of the normalized envelop E of the electromagnetic field emitted by terminal 3 just before a pause, during the pause, and just after the pause. The pause starts at a time t1 by a decrease in the amplitude of envelop E from a high level to reach, at a time t2, a low level, for example, substantially zero. The low level is maintained from time t2 to time t3, from which the amplitude of envelop E increases to reach, at time t4, the high level, and temporary oscillations around the high level can be observed.

Card 1 detects the beginning of the rise of the amplitude of envelop E at time t3. Call FDT (Frame Delay Time) the duration between time t3 and the beginning of the next response phase. Standards for telecommunications between terminal 3 and card 1 may impose constraints on the duration FDT that card 1 should respect; otherwise terminal 3 interrupts the communication if a response phase has not started. This may in particular be the case for a bank application, in particular when a communication protocol according to the type-A ISO/IEC 14443 standard is implemented, for example, at a 106-kbits/s rate, with an anti-collision phase based on a response of the card within fixed delays.

Thus, this imposes for time t3 to be correctly detected by card 1 so that the next response phase starts at the right time. The determination of time t3 is performed by processing circuit 11 based on the signal RXA delivered by shaping circuit 13. If the signal captured by antenna 9 perfectly reproduced the electromagnetic field emitted by terminal 3, shaping circuit 13 could deliver a signal RXA reproducing envelop E. However, the signal captured by antenna 9 may exhibit disturbances that it is necessary to filter so that, in practice, signal RXA cannot perfectly reproduce the variation of envelop E.

Figure 3:
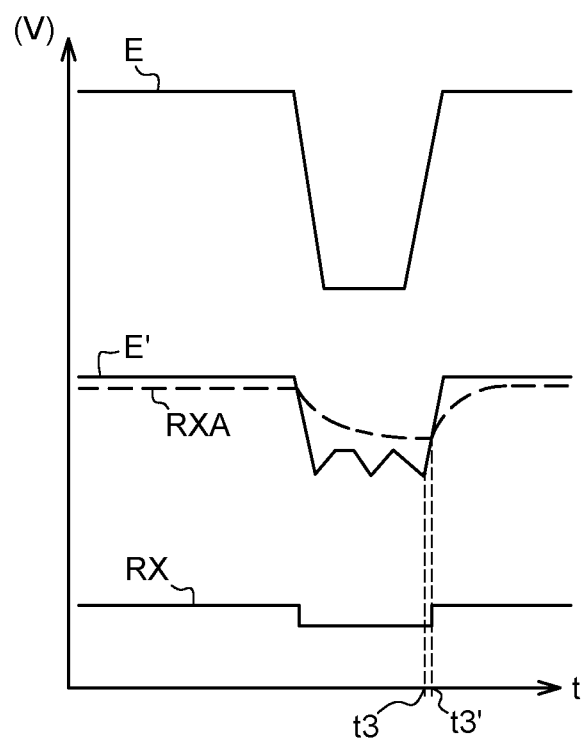
FIG. 3 is a timing diagram of various signals associated with the embodiment telepowered contactless card of FIG. 1.

FIG. 3 illustrates, from top to bottom, a timing diagram of the upper portion of the envelop E of the electromagnetic field emitted by antenna 5 of terminal 3; in full lines a timing diagram of the upper portion of the envelop E' of the signal captured by antenna 9 of card 1; in dotted lines a timing diagram of the signal RXA delivered by shaping circuit 13; and a timing diagram of the signal RX delivered by processing circuit 11 after demodulation of signal RXA.

The envelop E' of the electromagnetic field of the signal captured by antenna 9 may exhibit wobbling during the pause. It is necessary to filter this wobbling so that it does not appear on signal RXA and so that processing circuit 11 does not deliver binary signal RX at an incorrect value. This filtering results in a signal RXA having a rise at the end of the pause that may be delayed with respect to the rise of envelops E and E'. Since the detection of the end of the pause is performed based on signal RXA, the detected time t3' of the rise of signal RXA may be subsequent to the time t3 of the rise of envelop E'.

According to an embodiment, there is applied to antenna 9 an impedance. In embodiments, the impedance is only resistive during each pause of the electromagnetic field. In embodiments, the value of the resistive impedance is sufficiently low to suppress the wobbling of the envelop E' of the signal captured by antenna 9. In embodiments, the value of the resistive impedance is sufficiently high for the signal captured by antenna 9 to have significant dynamics, particularly when the magnetic field increases again at the end of the pause.

Figure 4:
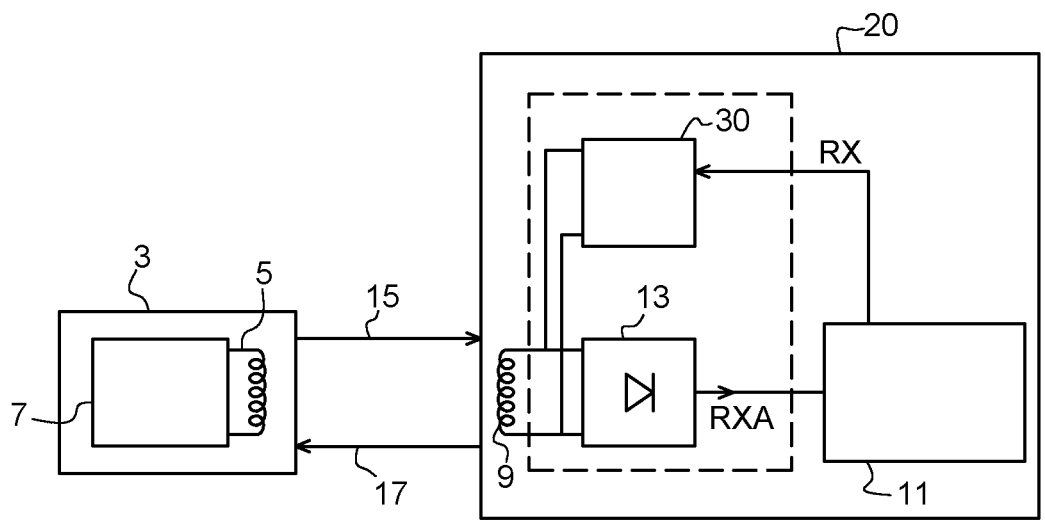
FIG. 4 is a block diagram of an embodiment telepowered contactless card arranged in the vicinity of a terminal.

FIG. 4 is a drawing similar to FIG. 1 and illustrates an embodiment of a telepowered contactless card 20 arranged in the vicinity of terminal 3. Card 20 includes all the elements of card 1 of FIG. 1, with the difference that it further includes circuit 30 for modifying the impedance seen by antenna 9. According to an embodiment, impedance modification circuit 30 receives signal RX. According to an embodiment, outside of pauses, impedance modification circuit 30 is deactivated.

Figure 5:
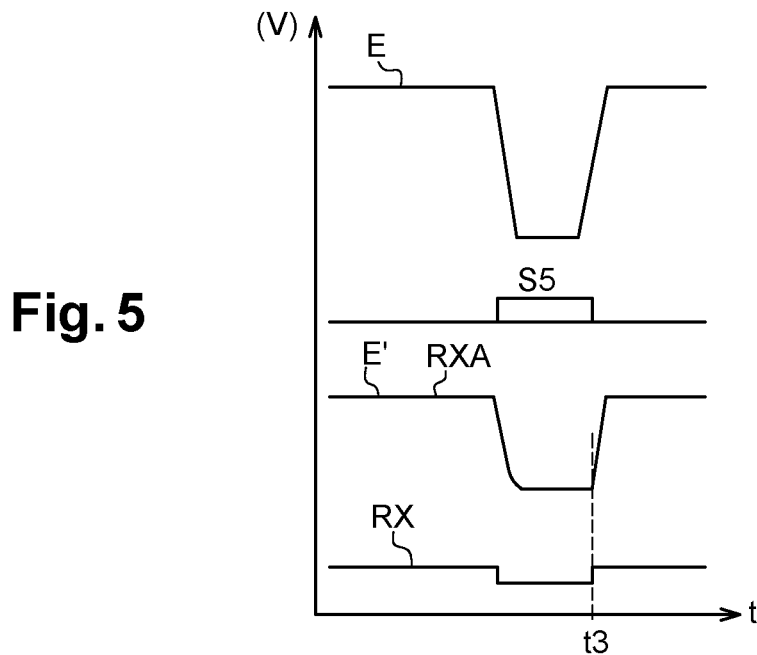
FIG. 5 is a timing diagram of various embodiment signals associated with the embodiment telepowered contactless card of FIG. 4.

FIG. 5 illustrates, from top to bottom, a timing diagram of the upper portion of the envelop E of the electromagnetic field emitted by antenna 5 of terminal 3, a timing diagram of a signal S5 of activation, described in further detail hereafter, of the resistive impedance delivered to antenna 9 by impedance modification circuit 30, a timing diagram of the upper portion of the envelop E' of the signal captured by the antenna 9 of card 20, and a timing diagram of the signal RX delivered by demodulator 11 for an embodiment of the circuit 30 for modifying the impedance seen by antenna 9.

The timing diagram of envelop E of the electromagnetic field in FIG. 5 is identical to that shown in FIG. 3. The timing diagram of envelop E' of the signal captured by antenna 9 of card 20 exhibits no wobbling. Signal RXA may then correspond substantially to envelop E'. Thereby, the determination of time t3 may be performed correctly.

Figure 6:
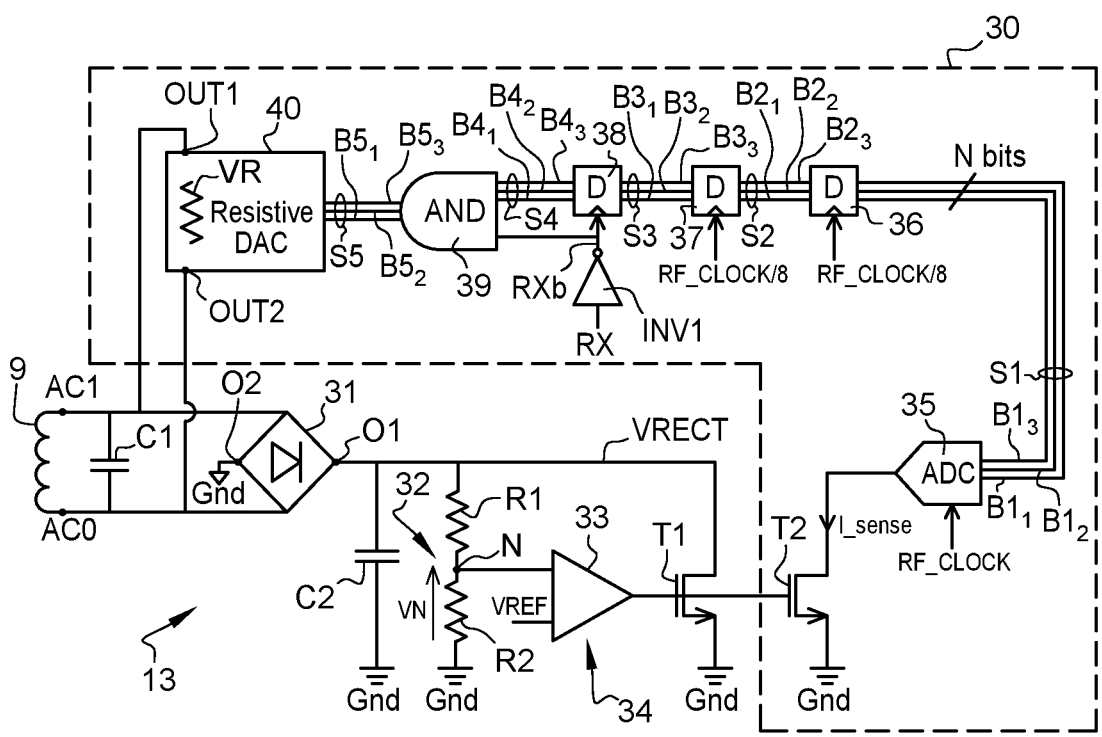
FIG. 6 is a schematic of an embodiment telepowered contactless card associated with the embodiment telepowered contactless card of FIG. 4.

FIG. 6 is an electric diagram of antenna 9, of an embodiment of shaping circuit 13, and of an embodiment of the impedance modification circuit 30 of card 20 used to obtain the timing diagrams illustrated in FIG. 5.

According to an embodiment, shaping circuit 13 includes: a capacitor C1 coupled in parallel to the terminals AC1 and AC0 of antenna 9; a rectifying bridge 31, for example, a diode bridge, including two inputs coupled, preferably connected, respectively to terminals AC1 and AC0, a first output O1 delivering a rectified signal VRECT and a second output O2 coupled to a source of a low reference potential Gnd, for example, the ground of card 20; a capacitor C2 having a first plate coupled, preferably connected, to the first output O1 of rectifying bridge 31 and a second plate coupled, preferably connected, to the source of low reference potential Gnd; a voltage dividing bridge 32 including for example two resistors R1 and R2 in series between the first output S of rectifying bridge 31 and the source of low reference potential Gnd; an insulated-gate field effect transistor T1, also called MOS transistor (Metal Oxide Semiconductor), for example, with an N channel, having its drain coupled, preferably connected, to the first output O1 of rectifying bridge 31 and having its source coupled, preferably connected, to the source of low reference potential Gnd; and a difference amplified 33 including a first input (+) coupled, preferably connected, to a node N between resistors R1 and R2, a second input (−) receiving a reference voltage VREF, and an output coupled, preferably connected, to the gate of transistor T1.

The assembly including voltage dividing bridge 32, amplifier 33, and MOS transistor T1 forms a circuit 34 for controlling the impedance seen by antenna 9. Such a circuit 34 for controlling the impedance seen by antenna 9 having the structure shown in FIG. 6 corresponds to a fast antenna impedance manager circuit placed after rectifying bridge 31. However, circuit 34 for controlling the impedance seen by antenna 9 may have a structure different from that shown in FIG. 4. It may be a fast antenna impedance manager placed before rectifying bridge 31.

According to an embodiment, impedance modification circuit 30 includes: a MOS transistor T2, for example, with an N channel, having its gate coupled, preferably connected, to the gate of transistor T1, having its source coupled, preferably connected, to the source of low reference potential Gnd, and having its drain receiving a current I_sense; an analog-to-digital converter 35 (ADC), rated by a clock signal RF_CLOCK including an input coupled, preferably connected, to the drain of transistor T2, and N outputs each delivering a first binary signal B1$i$, $i$ being an integer varying from 1 to N, the first binary signals B1$i$ forming a digital signal S1 with N bits, N being an integer greater than or equal to 1, for example, varying from 1 to 20, and equal to 3 as an example in FIG. 6; N first flip-flops 36 (D), preferably of type D, each ith flip-flop 36, with i varying from 1 to N, being rated by a clock signal RF_CLOCK/8, having its frequency equal to a sub-multiple, for example, equal to the eighth, of the frequency of clock signal RF_CLOCK, receiving the first binary signal B1$i$, and outputting a second binary signal B2$i$, the second binary signals B2$i$ forming a second digital signal S2; N second flip-flops 37 (D), preferably of type D, each ith flip-flop 37, with i varying from 1 to N, being rated by clock signal RF_CLOCK/8, receiving second binary signal B2$i$, and outputting a third binary signal B3$i$, the third binary signals B3$i$ forming a third digital signal S3; N third flip-flops 38 (D), preferably of type D, each ith flip-flop 38, with i varying from 1 to N, being rated by a signal RXb, receiving third binary signal B3$i$, and outputting a fourth binary signal B4$i$, the fourth binary signals B4$i$ forming a fourth digital signal S4; an inverter INV1 having its input receiving signal RX and having its output delivering signal RXb; N logic gates 39 (AND) each achieving the logic AND function, each ith logic gate 39, with i varying from 1 to N, including a first input receiving the fourth binary signal B4$i$ and a second input receiving signal RXb, and outputting a fifth binary signal B5$i$, the fifth binary signals B5$i$ forming a fifth digital signal S5; and a resistive digital-to-analog converter (resistive DAC) 40 receiving the fifth digital signal S5 and including two output terminals coupled, preferably connected, respectively to the terminals AC0 and AC1 of antenna 9 in the embodiment illustrated in FIG. 6.

According to an embodiment, resistive digital-to-analog converter 40 is a unary network converter, a binary network converter, and an R-2R network. In particular, digital-to-analog converter 40 delivers a very high resistance value, preferably an infinite resistance value corresponding to an open circuit, when the digital signal received as an input is at "0."

Figure 7:
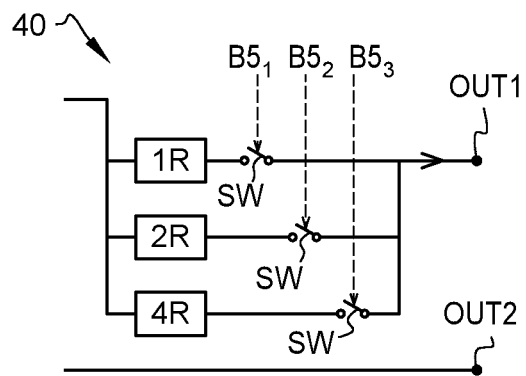
FIG. 7 is a schematic of an embodiment circuit associated with the embodiment telepowered contactless card of FIG. 6.
Figure 8:
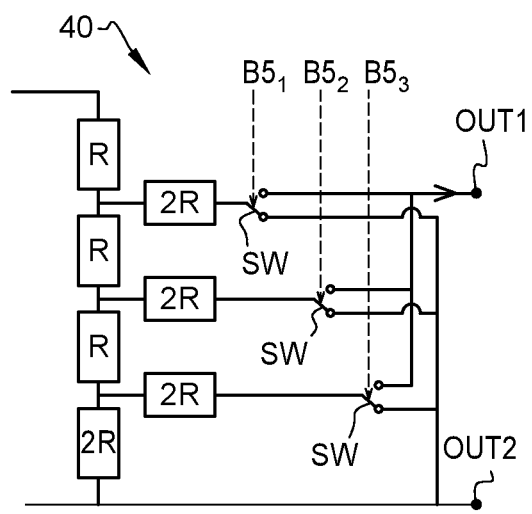
FIG. 8 is a schematic of an embodiment circuit associated with the embodiment telepowered contactless card of FIG. 6.

FIGS. 7 and 8 show embodiments of digital-to-analog converter 40 of resistive type. Each of these digital-to-analog converters 40 includes resistors and switches SW, each switch SW being controlled by one of binary signals B5$_i$, with i varying from 1 to N. Each of these digital-to-analog converters 40 further includes two output terminals OUT1 and OUT2 between which is applied the resistance value VRES delivered by converter 40. According to an embodiment, as shown in FIG. 6, terminal OUT1 may be coupled, preferably connected, to the terminal AC1 of antenna 9, and terminal OUT2 may be coupled, preferably connected, to the terminal AC0 of antenna 9. According to another embodiment, impedance modification circuit 30 may include first and second digital-to-analog converters 40, each receiving digital signal S5, the first digital-to-analog converter 40 applying resistance value VRES between terminal AC1 of antenna 9 and the source of low reference potential Gnd and the second digital-to-analog converter 40 applying resistance value VRES between terminal AC2 of antenna 9 and the source of low reference potential Gnd.

In FIG. 7, digital-to-analog converter 40 is of binary network type. This means that it uses resistors of different values 1R, 2R, 4R, the value of each resistance corresponding to the binary weight of each binary signal B5$_i$. In FIG. 8, digital-to-analog converter 40 is of ladder network type. This means that the resistance network forms a ladder with a small number of elementary resistance values. In particular, the network may be of R-2R type with two elementary resistance values R and 2R.

The operation of shaping circuit 13 shown in FIG. 6 is the following. The voltage across antenna 9 is rectified by rectifying bridge 31 and filtered by capacitor C2 and resistors R1 and R2. Amplifier 33 delivers to transistor T1 a gate voltage proportional to the difference between the voltage VN at node N, proportional to voltage VRECT, and reference voltage VREF. Transistor T1 is thus more or less conductive according to the difference between the voltage VN at node N and reference voltage VREF.

The operation of the impedance modification circuit 30 shown in FIG. 6 is the following. The ratio K between the widths of transistors T1 and T2 is smaller than one, for example, equal to 1/100. Transistors T1 and T2 are controlled at their gate by the same signal. The current I_sense flowing through transistor T2 is proportional to the current flowing through transistor T1. Analog-to-digital converter 35 delivers the digital signal S1 corresponding to the digital conversion of the intensity of current I_sense.

The i$^{th}$ flip-flop 36, with i varying from 1 to N, copies at its output the binary signal B1$_i$ received as an input at each rising edge of signal RF_CLOCK/8.

The second binary signal B2$_i$ thus forms a second digital signal S2 which corresponds to a sampling of the first digital signal S1 at a frequency equal to one-eighth of the frequency of signal RF_CLOCK. Each i$^{th}$ flip-flop 37 copies at its output the binary signal B2$_i$ received as an input at each rising edge of signal RF_CLOCK/8.

Third binary signal B3$_i$ thus forms a third digital signal S3 which corresponds to second digital signal S2 to within the delay due to the operation of second flip-flops 37. Each i$^{th}$ flip-flop 38 copies at its output the binary signal B3$_i$ received as an input at each rising edge of signal RXb.

The fourth binary signal B4$_i$ thus forms a fourth digital signal S4 which corresponds to a sampling of the third digital signal S3 at the rising edge of signal RXb, that is, at the falling edge of signal RX. Each i$^{th}$ AND logic gate 39 outputs binary signal B5$_i$ which is equal to the binary signal B4$_i$ received as an input when signal RXb is at "1" (that is, when signal RX is at "0"), and which is equal to "0" when signal RXb is at "0" (that is, when signal RX is at "1").

The fifth binary signal B5$_i$ thus forms a fifth digital signal S5 which corresponds to the fourth digital signal S4 when signal RXb is at "1" (that is, when signal RX is at "0"), and which is equal to "0" when signal RXb is at "0" (that is, when signal RX is at "1"). Digital-to-analog converter 40 provides a resistance having a value corresponding to the analog conversion of digital signal S5.

Before the beginning of a pause, the envelop E of the electromagnetic field received by antenna 9 is maximum so that the signal RX delivered by processing circuit 11 is at "1" and signal RXb is at "0." Digital signal S5 thus is at "0." Digital-to-analog converter 40 outputs the resistance value corresponding to an input equal to "0," preferably a very high resistance value, preferably an infinite resistance value corresponding to an open circuit, when the digital signal received as an input is "0." When a pause of the electromagnetic field starts, signal RX switches to "0" and signal RXb switches to "1." Digital signal S5 becomes different from "0" and then corresponds to the value taken by digital signal S1. This digital signal S5 is transmitted to digital-to-analog converter 40 which outputs a resistance value VRES corresponding to the digital-to-analog conversion of digital signal S5. The resistance value VRES delivered by impedance modification circuit 30 during the pause thus depends on the value of the electromagnetic field a little before the beginning of the pause. At the end of the pause, the amplitude of the envelop E of the electromagnetic field received by antenna 9 increases. Signal RX switches to "1" and signal RXb switches to "0" so that digital signal S5 switches back to "0." According to an embodiment, outside of pauses, impedance modification circuit 30 is deactivated and digital-to-analog converter 40 outputs the resistance value corresponding to an input equal to "0," preferably a very high resistance value, preferably an infinite resistance value corresponding to an open circuit, whatever the real value received as an input.

First simulations have been performed. For the first simulations, the processing circuit 11 and impedance modification circuit 30 have the structures shown in FIG. 6.

Figure 9:
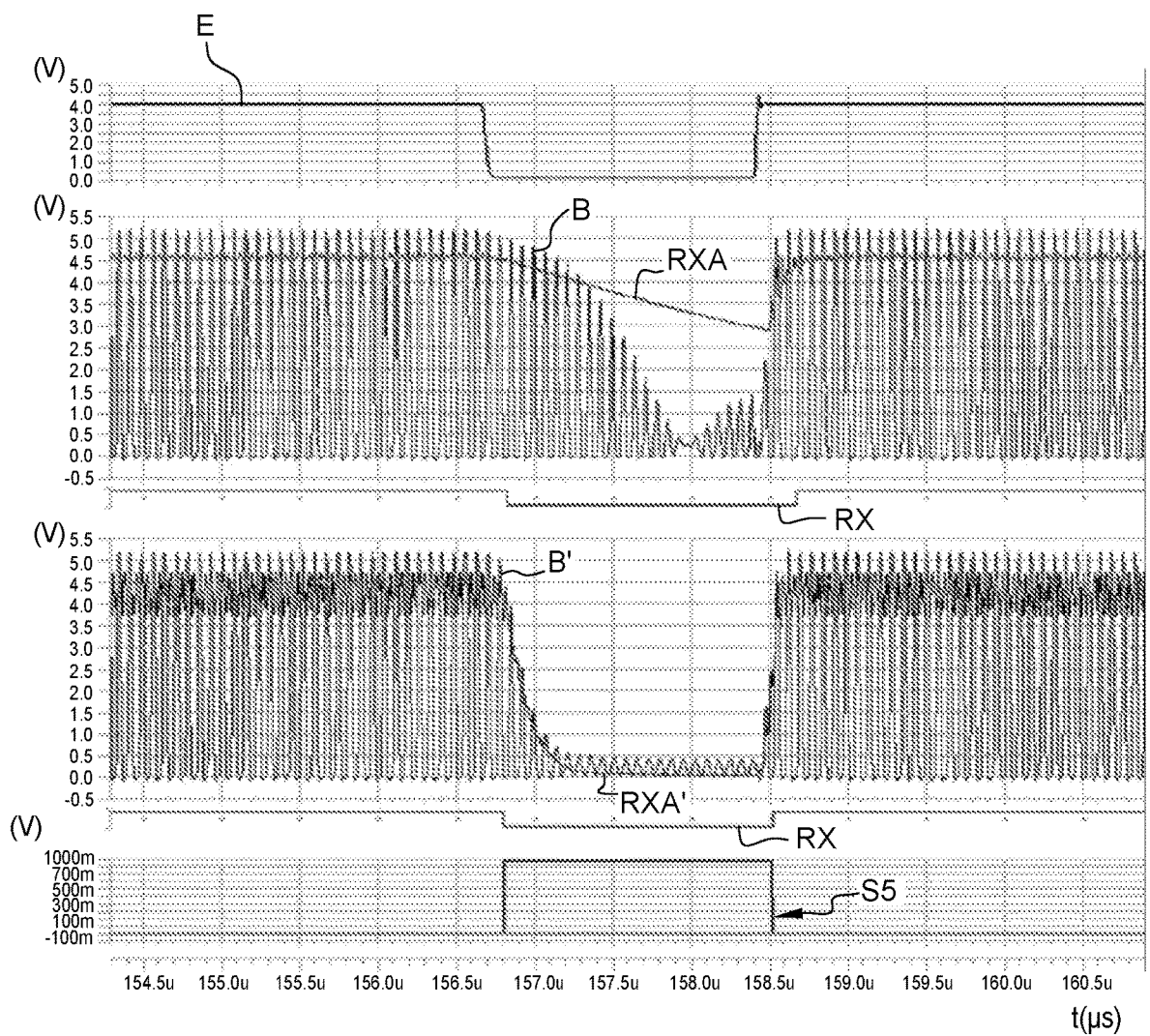
FIG. 9 is a timing diagram of various embodiment signals associated with the embodiment telepowered contactless card of FIG. 6.

FIG. 9 illustrates, from top to bottom, according to the time during a pause: a curve of the variation of the envelop E of the electromagnetic field emitted by terminal 3; a curve of variation of the signal B captured by antenna 9, a curve of variation of signal RXA, and a curve of variation of binary signal RX, in the absence of impedance modification circuit 30; a curve of variation of the signal B' captured by antenna 9, a curve of variation of signal RXA', and a curve of variation of binary signal RX', in the presence of impedance modification circuit 30; and a curve of variation of digital signal S5 after digital-to-analog conversion.

As shown in FIG. 9, the curve of variation of signal B captured by antenna 9 in the absence of impedance modification circuit 30 exhibits wobbling during the pause while no wobbling can be observed on curve B' in the presence of impedance modification circuit 30.

In the previously-described embodiment, the duration for which circuit 30, used to modify the impedance seen by antenna 9, presents to antenna 9 a resistance value VRES during a pause corresponds to the duration for which signal RX is at "0." According to another embodiment of impedance modification circuit 30, the duration for which circuit 30, used to modify the impedance seen by antenna 9, presents to antenna 9 a resistance value VRES during a pause corresponds to a predetermined duration.

Figure 10:
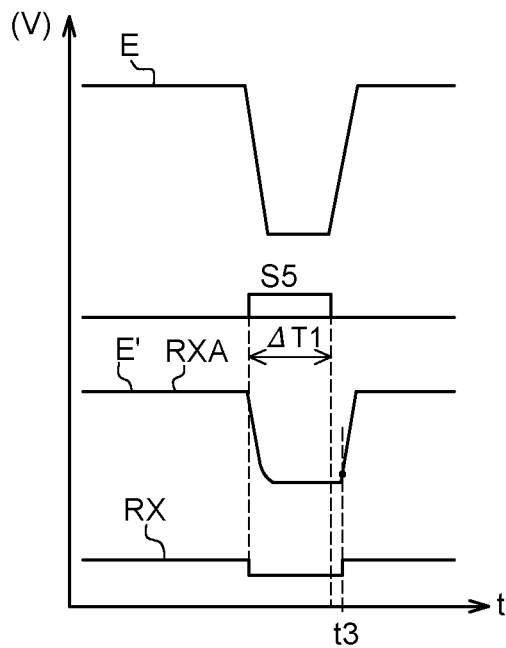
FIG. 10 is a timing diagram of various embodiment signals associated with the embodiment telepowered contactless card of FIG. 4.

FIG. 10 illustrates timing diagrams similar to FIG. 5 for an embodiment of circuit 30, used to modify the impedance seen by antenna 9, in which the duration for which the circuit 30 presents to antenna 9 a resistance value VRES during a pause corresponds to a predetermined duration.

The timing diagram of envelop E of the electromagnetic field emitted by terminal 3 is identical to that shown in FIG. 3. Envelop E' of the electromagnetic field received by the antenna 9 of card 20 exhibits no wobbling. Signal RXA may then correspond substantially to envelop E'.

The presentation by circuit 30 of impedance value VRES to antenna 9 may be performed at time tA in the same way as previously described in relation to FIG. 5. The end of the presentation by circuit 30 of impedance value VRES to antenna 9 may be performed after the elapsing of a duration ΔT1 after time tA.

Figure 11:
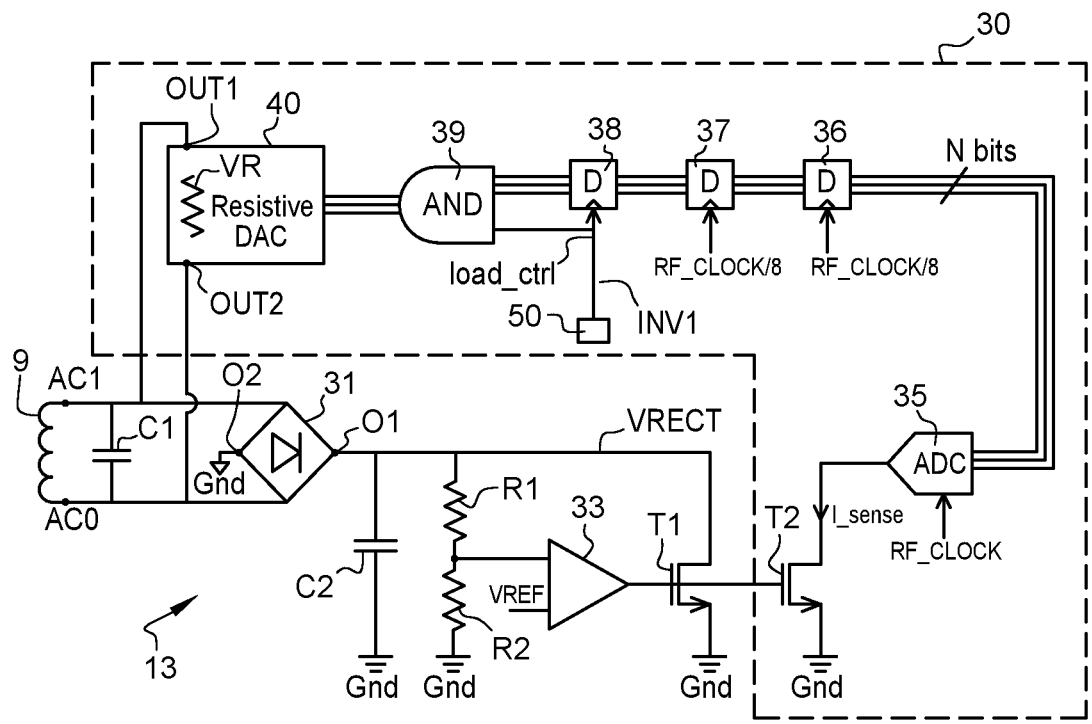
FIG. 11 is a schematic of an embodiment telepowered contactless card associated with the embodiment telepowered contactless card of FIG. 4.

FIG. 11 is an electric diagram of an embodiment of shaping circuit 13 and of the impedance modification circuit 30 of card 20 enabling to obtain the timing diagrams illustrated in FIG. 10. Circuits 13 and 30 of card 20 have the same structure as that shown in FIG. 6 with the difference that inverter INV1 is not present and the third flip-flops 38 and logic gates 38 receive a binary signal load_ctrl delivered by a circuit 50. Signal load_ctrl exhibits a rising edge simultaneously with the falling edge of signal RX at the beginning of the pause and exhibits a falling edge that follows the rising edge after the elapsing of duration ΔT1.

Figure 12:
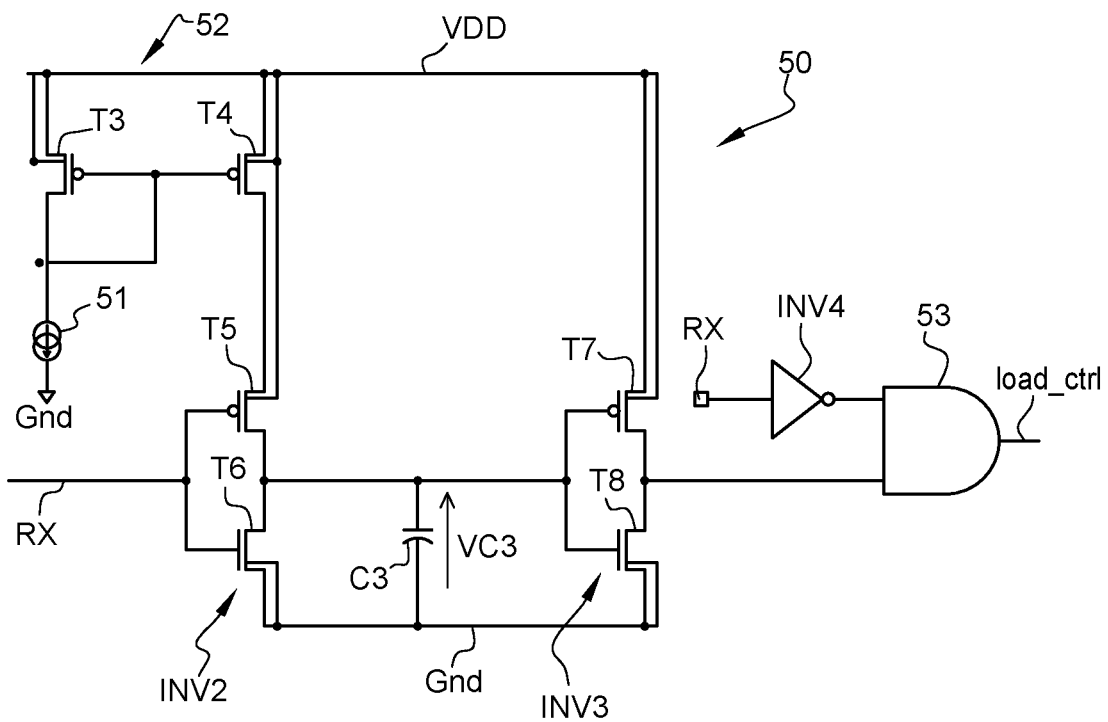
FIG. 12 is a schematic of an embodiment telepowered contactless card associated with the embodiment telepowered contactless card of FIG. 11.

FIG. 12 illustrates an embodiment of circuit 50 for delivering binary signal load_ctrl. Circuit 50 includes: a current source 51 having a first terminal coupled, preferably connected, to the source of low reference potential Gnd; a current mirror 52 including a MOS transistor T3, for example, with a P channel, having its source coupled, preferably connected, to a source of a high reference potential VDD, having its drain coupled, preferably connected, to a second terminal of current source 51, and having its gate connected to the drain, and a MOS transistor T4, for example with a P channel, having its source coupled, preferably connected, to the source of high reference potential VDD and having its drain connected to the gate of transistor T3; an inverter INV2 receiving as an input signal RX, including for example a MOS transistor T5, for example with a P channel, having its source coupled, preferably connected, to the drain of transistor T4, having its drain coupled, preferably connected, to the output of inverter INV2, and having its gate coupled, preferably connected, to the input of inverter INV2, and a MOS transistor T6, for example, with an N channel, having its source coupled, preferably connected, to the source of low reference potential Gnd, having its drain coupled, preferably connected, to the output of inverter INV2, and having its gate coupled, preferably connected, to the input of inverter INV2; a capacitor C3 having a first plate coupled, preferably connected, to the output of inverter INV2, and having a second plate coupled, preferably connected, to the source of low reference potential Gnd, the voltage across capacitor C3 being called VC3; an inverter INV3 having its input coupled, preferably connected, to the first plate of capacitor C3, for example including a MOS transistor T7, for example, with a P channel, having its source coupled, preferably connected, to the source of high reference potential VDD, having its drain coupled, preferably connected, to the output of inverter INV3, and having its gate coupled, preferably connected, to the input of inverter INV2, and a MOS transistor T8, for example, with an N channel, having its source coupled, preferably connected, to the source of low reference potential Gnd, having its drain coupled, preferably connected, to the output of inverter INV3, and having its gate coupled, preferably connected, to the input of inverter INV2, the voltage between the output of inverter INV3 and low reference potential Gnd being called VSINV3; an inverter INV4 having its input receiving signal RX; and an AND logic gate 53 having a first input receiving the output of inverter INV4, having a second input receiving the output of inverter INV3, and outputting signal load_ctrl.

Circuit 50 operates as follows. Before the pause, signal RX is at "1." The first input of AND logic gate 53 is thus at "0," and signal load_ctrl is at "0." Further, the voltage across capacitor C3 being substantially zero, capacitor C3 is discharged and the output signal of inverter INV3 (and thus the second input of AND logic gate 53) is at "1." At the beginning of the pause, signal RX switches to "0." The first input of AND logic gate 53 thus switches to "1." Capacitor C3 is discharged, the output signal of inverter INV3 (and thus the second input of AND logic gate 53) remains at "1." Signal load_ctrl thus switches to "1." Capacitor C3 charges so that the voltage thereacross increases. When the voltage across capacitor C3 is sufficiently high after duration ΔT1, the output of inverter INV3 (and thus the second input of AND logic gate 53) switches to "0." Signal load_ctrl thus switches to "0" at the end of duration ΔT1. When signal RX switches back to "1," capacitor C3 is discharged.

Second simulations have been performed. For the second simulation, circuit 50 has the structure shown in FIG. 12.

Figure 13:
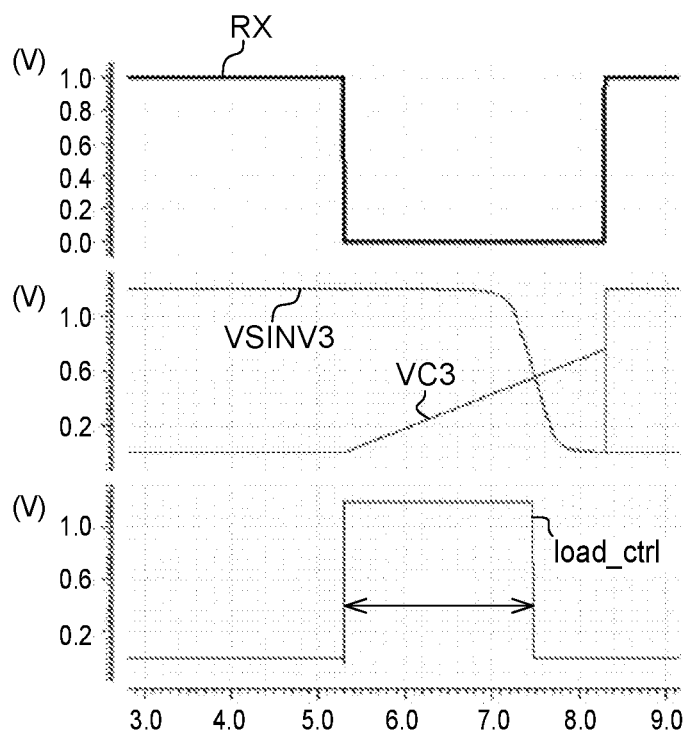
FIG. 13 is a timing diagram of signals used to create a delay according to an embodiment.

FIG. 13 illustrates, from top to bottom, according to the time during a pause: a curve of variation of signal RX; a curve of variation of the voltage across capacitor C3; a curve of variation of voltage VISIN3; and a curve of variation of signal load_ctrl.

As shown in FIG. 13, the duration ΔT1 at state "1" of signal load_ctrl particularly depends on the charge duration of capacitor C3 and can thus be predetermined.

Various embodiments and variants have been described. It will be understood by those skilled in the art that certain features of these various embodiments and variations may be combined and other variations will occur to those skilled in the art.

Finally, the practical implementation of the embodiments and variants described herein is within the capabilities of those skilled in the art based on the functional indications provided hereinabove.

What is claimed is:

1. A method, comprising:
   receiving, by an antenna couplable to an electronic device, an amplitude-modulated analog signal associated with an electromagnetic field generated by an external device, the electromagnetic field having intervals with minimal levels;
   generating a demodulated signal based on the amplitude-modulated analog signal, the demodulated signal comprising a rectified, filtered, and demodulated signal of the amplitude-modulated analog signal;

generating a binary signal based on the demodulated signal;
determining a maximum amplitude value of the electromagnetic field before a pause based on the binary signal; and
coupling a resistance to the antenna during the pause, a value of the resistance being based on the maximum amplitude value.

2. The method of claim 1, wherein the coupling comprises coupling the resistance to the antenna in response to a change in the binary signal from a first state to a second state.

3. The method of claim 2, further comprising decoupling the resistance from the antenna in response to a change in the binary signal from the second state to the first state.

4. The method of claim 2, further comprising decoupling the resistance from the antenna in response to a completion of a constant duration after coupling the resistance to the antenna.

5. The method of claim 1, further comprising:
converting the demodulated signal to a first digital signal;
generating a second digital signal based on the first digital signal, the second digital signal being equal to the first digital signal with a delay;
generating a third digital signal, the third digital signal having a constant digital value in response to the binary signal being in a first state, the third digital signal having a digital value equal to a value of the second digital signal in response to the binary signal changing from the first state to a second state; and
converting the third digital signal to the value of the resistance.

6. An electronic device, comprising:
a first circuit configured to generate a demodulated signal based on an amplitude-modulated analog signal, the demodulated signal comprising a rectified, filtered, and demodulated signal of the amplitude-modulated analog signal, the amplitude-modulated analog signal associated with an electromagnetic field generated by an external device and received by an antenna couplable to the electronic device, the electromagnetic field having intervals with minimal levels;
a second circuit configured to generate a binary signal based on the demodulated signal; and
a third circuit configured to couple a resistance to the antenna during a pause, a value of the resistance being based on a maximum amplitude value of the electromagnetic field before the pause, the maximum amplitude value being determined based on the binary signal.

7. The electronic device of claim 6, wherein the third circuit is configured to couple the resistance to the antenna in response to a change in the binary signal from a first state to a second state.

8. The electronic device of claim 7, wherein the third circuit is configured to decouple the resistance from the antenna in response to a change in the binary signal from the second state to the first state.

9. The electronic device of claim 7, wherein the third circuit is configured to decouple the resistance from the antenna in response to a completion of a constant duration after coupling the resistance to the antenna.

10. The electronic device of claim 6, wherein the third circuit comprises:
an analog-to-digital converter (ADC) configured to convert the demodulated signal to a first digital signal;
a fourth circuit configured to generate a second digital signal based on the first digital signal, the second digital signal being equal to the first digital signal with a delay;
a fifth circuit configured to generate a third digital signal, the third digital signal having a constant digital value in response to the binary signal being in a first state, the third digital signal having a digital value equal to a value of the second digital signal in response to the binary signal changing from the first state to a second state; and
a resistive digital-to-analog converter (DAC) configured to convert the third digital signal to the value of the resistance.

11. The electronic device of claim 10, wherein the ADC is clocked by a first clock signal, and wherein the fourth circuit comprises a flip-flop circuit clocked by a second clock signal, a frequency of the second clock signal being a sub-multiple of a frequency of the first clock signal.

12. The electronic device of claim 10, wherein the fifth circuit comprises:
a flip-flop circuit clocked by an inverse of a second binary signal, the flip-flop circuit configured to receive the second digital signal; and
AND-type logic gates, each AND-type logic gate configured to:
output a different bit of bits of the third digital signal,
receive the second binary signal at a first input, and
receive an output of a different flip-flop of the flip-flop circuit at a second input.

13. The electronic device of claim 12, wherein the second binary signal is equal to the binary signal.

14. The electronic device of claim 12, wherein each rising edge of the second binary signal is simultaneous with a corresponding falling edge of the binary signal, and wherein each falling edge of the second binary signal follows a rising edge of the second binary signal, the rising edge of the second binary signal preceding each falling edge of the second binary signal by a constant duration.

15. A contactless read card, comprising:
an antenna configured to receive an amplitude-modulated analog signal associated with an electromagnetic field generated by an external device, the electromagnetic field having intervals with minimal levels;
a first circuit coupled to the antenna, the first circuit configured to generate a demodulated signal based on the amplitude-modulated analog signal, the demodulated signal comprising a rectified, filtered, and demodulated signal of the amplitude-modulated analog signal;
a second circuit configured to generate a binary signal based on the demodulated signal; and
a third circuit configured to couple a resistance to the antenna during a pause, a value of the resistance being based on a maximum amplitude value of the electromagnetic field before the pause, the maximum amplitude value being determined based on the binary signal.

16. The contactless read card of claim 15, wherein the third circuit is configured to couple the resistance to the antenna in response to a change in the binary signal from a first state to a second state.

17. The contactless read card of claim 16, wherein the third circuit is configured to decouple the resistance from the antenna in response to a change in the binary signal from the second state to the first state.

18. The contactless read card of claim 16, wherein the third circuit is configured to decouple the resistance from the antenna in response to a completion of a constant duration after coupling the resistance to the antenna.

19. The contactless read card of claim 16, wherein the third circuit comprises:
   an analog-to-digital converter (ADC) configured to convert the demodulated signal to a first digital signal;
   a fourth circuit configured to generate a second digital signal based on the first digital signal, the second digital signal being equal to the first digital signal with a delay;
   a fifth circuit configured to generate a third digital signal, the third digital signal having a constant digital value in response to the binary signal being in a first state, the third digital signal having a digital value equal to a value of the second digital signal in response to the binary signal changing from the first state to a second state; and
   a resistive digital-to-analog converter (DAC) configured to convert the third digital signal to the value of the resistance.

20. The contactless read card of claim 19, wherein the ADC is clocked by a first clock signal, and wherein the fourth circuit comprises a flip-flop circuit clocked by a second clock signal, a frequency of the second clock signal being a sub-multiple of a frequency of the first clock signal.

* * * * *